US007506297B2

(12) United States Patent
Mukherjee et al.

(10) Patent No.: US 7,506,297 B2
(45) Date of Patent: Mar. 17, 2009

(54) METHODOLOGY FOR SCHEDULING, PARTITIONING AND MAPPING COMPUTATIONAL TASKS ONTO SCALABLE, HIGH PERFORMANCE, HYBRID FPGA NETWORKS

(75) Inventors: Arindam Mukherjee, Charlotte, NC (US); Arun Ravindran, Charlotte, NC (US)

(73) Assignee: University of North Carolina at Charlotte, Charlotte, NC (US)

( * ) Notice: Subject to any disclaimer, the term of this patent is extended or adjusted under 35 U.S.C. 154(b) by 269 days.

(21) Appl. No.: 11/152,924

(22) Filed: Jun. 15, 2005

(65) Prior Publication Data

US 2005/0278680 A1    Dec. 15, 2005

Related U.S. Application Data

(60) Provisional application No. 60/579,525, filed on Jun. 15, 2004.

(51) Int. Cl.
*G06F 17/50* (2006.01)
(52) U.S. Cl. .............................. 716/18; 716/15; 716/16; 716/17; 712/16; 703/14; 326/39
(58) Field of Classification Search ............. 716/15–18; 712/16; 703/14; 326/39
See application file for complete search history.

(56) References Cited

U.S. PATENT DOCUMENTS 5,175,843 A * 12/1992 Casavant et al. ................ 716/6
5,588,152 A * 12/1996 Dapp et al. .................... 712/16
6,779,183 B1 * 8/2004 Chekuri et al. .............. 718/105

OTHER PUBLICATIONS

Srinivasan et al., "Fine-grained and coarse-grained behavioral partitioning with effective utilization of memory and design space exploration for multi-FPGA architectures", Very Large Scale Integration (VLSI) Systems, IEEE Transactions on vol. 9, Issue 1, Feb. 2001 pp. 140-158.*
Signh et al.: "PITIA: an FPGA for throughput-intensive applications"; Very Large Scale Integration (VLSI) Systems, IEEE; Transactions on vol. 11, Issue 3, Jun. 2003 pp. 354-363.*
Hand et al.; "A fast macro based compilation methodology for partially reconfigurable FPGA designs"; Handa, M.; VLSI Design, 2003. Proceedings. 16th International Conference on Jan. 4-8, 2003 pp. 91-96.*

* cited by examiner

*Primary Examiner*—Naum B Levin
(74) *Attorney, Agent, or Firm*—Tillman Wright, PLLC; James D. Wright; Chad D. Tillman

(57) ABSTRACT

An automatically reconfigurable high performance FPGA system that includes a hybrid FPGA network and an automated scheduling, partitioning and mapping software tool adapted to configure the hybrid FPGA network in order to implement a functional task. The hybrid FPGA network includes a plurality of field programmable gate arrays, at least one processor, and at least one memory. The automated software tool adapted to carry out the steps of scheduling portions of a functional task in a time sequence, partitioning a plurality of elements of the hybrid FPGA network by allocating or assigning network resources to the scheduled portions of the functional task, mapping the partitioned elements into a physical hardware design for implementing the functional task on the plurality of elements of the hybrid FPGA network, and iteratively repeating the scheduling, partitioning and mapping steps to reach an optimal physical hardware design.

12 Claims, 9 Drawing Sheets

METHODOLOGY FOR SCHEDULING, PARTITIONING AND MAPPING COMPUTATIONAL TASKS ONTO SCALABLE, HIGH PERFORMANCE, HYBRID FPGA NETWORKS

CROSS-REFERENCE TO RELATED APPLICATION

This application is entitled to the benefit of, and claims priority to, provisional U.S. patent application Ser. No. 60/579,525 filed Jun. 15, 2004 and entitled "FPGA BASED HARDWARE ACCELERATORS FOR BIOINFORMATICS," the entirety of which is incorporated herein by reference.

BACKGROUND OF THE PRESENT INVENTION

1. Field of the Present Invention

The present invention relates generally to scalable, high performance hybrid FPGA networks, and, in particular, to a methodology for scheduling, partitioning and mapping variable computational tasks onto scalable, high performance networks of FPGAs, memory arrays and processors.

2. Background

High performance computing ("HPC") finds extensive use in diverse areas including materials simulation, weather modeling, drug development, automotive design, oil exploration and financial forecasting. According to market intelligence and advisory firm IDC, the worldwide market for high performance computing machines grew by 30 percent in 2004. IDC's data shows that the HPC market hit $7.25 billion in 2004 up from $6.5 billion in 2003.

Traditional supercomputers costs millions of dollars and is complex to maintain and operate. Recent years have witnessed the emergence of clusters and grids of low cost workstations capable of delivering gigaflops of computing power. Commercial microprocessors such as Intel Xeon and AMD Opteron serve as the core computing engines of cluster computing architectures. However, microprocessors are general purpose computing architectures, and are not necessarily well suited to deliver the high performance computing capability required for a given computationally intensive application. With the CMOS technology entering the sub-100 nm regime, limitations in technology such as reliability and leakage issues have posed a significant barrier in continually increasing the clock speed of processor architectures. For example, Intel Corporation has shifted microprocessor performance emphasis from raw clock speeds to architectural innovations such as the use of dual core processors. However, the effective use of these new microprocessor paradigms requires extensive modification of current software.

Other HPC solutions have also been offered. Many general purpose HPC machines (i.e., not tailored to any specific application domain) are available from suppliers such as IBM, Sun, SGI, Cray, Fujitsu. Cluster machines are available from Dell and a variety of other vendors (such as Aptiva, LinuxX). Unfortunately, such solutions tend to be proprietary and thus not of a design that may be easily controlled or customized for a particular application, other than as provided by the supplier. Of equal importance, the designs tend not to be scalable.

While microprocessors provide software flexibility, Application Specific Integrated Circuits ("ASICs"), where a given computational algorithm is directly implemented on silicon, provides the highest performance for a given CMOS technology. The company Clearspeed is one such provider of such solutions. However, the high cost and long design cycle makes ASIC solutions viable only for extremely high volume applications. Moreover, the lack of programmability of ASICs severely limits their flexibility in implementing minor modifications of a given computational algorithm.

Field Programmable Gate Arrays ("FPGAs"), available from such companies as Xilinx, Inc. and Altera, allow hardware programming of logic primitives to realize a certain computational algorithm. Thus, they enjoy the programmability of microprocessors and offer the ability to directly realize computational tasks on hardware (at a lower performance compared to ASICs). However, until recently,. FPGAs have been low performance devices, with low gate count, and limited computer aided design tools that limited their use to logic prototyping. The recent years have witnessed a dramatic improvement in the computational capability of FPGAs with platform FPGAs containing more than 10 million system gates and incorporating complex heterogeneous structures, such as Power PC processors. For example, a Viretex-II Pro family from Xilinx Inc. integrates on a single chip, two PowerPC processor blocks, 444 multiplier blocks, 444 block RAMs of 18K each, multi-gigabit transceivers, 99216 programmable logic cells, and many other components. The availability of such high performance FPGAs opens the possibility of implementing computational intensive algorithms on FPGAs instead of merely using them as prototyping device. In a computational cluster such FPGAs in conjunction with microprocessors could serve as hardware accelerators for acceleration of computationally intensive tasks delivering significant increase in performance. In the investigators research group, for example, an FPGA implementation of the gene sequence alignment Smith Waterman bioinformatics algorithms, demonstrated a increase in performance, as compared to a typical conventional workstation (the SunFire 280R), by two to three orders of magnitude.

While successive generations of FPGAs have higher transistor counts, the fixed hardware resources of a given FPGA often implies that multiple FPGAs are required to implement a complex computational architecture. Recognizing this need, FPGA vendors, such as Xilinx Inc., have introduced 10 Gb/s on-chip transceivers for inter-FPGA communication. Taking advantage of this, FPGA board vendors, such as Nallatech Inc., have introduced products where each board consists of 4 Virtex-II Pro FPGAs with 3 gigabytes of external RAM. Each FPGA can have embedded processor cores. Several such boards can be plugged into the PCI-X slots of host workstations that can be in a cluster or grid. Such architectures allow the construction of scalable systems, where the system designer can readily increase the number of FPGAs and memory arrays, based on the computational requirements and the budgetary constraints. Also, the FPGA network architecture makes it easier to follow the technology curve by enabling independent upgradation of individual FPGA nodes.

SGI and Cray are among the HPC suppliers using FPGAs for hardware acceleration. Starbridge implements an entire computer using a fixed network of FPGAs. Unfortunately, such approaches provide are not easily programmable and thus provide little flexibility.

In another approach, offered by Mitrionics AB of Lund, Sweden, a task-specific programmable architecture may be implemented on a single FPGA. Unfortunately, each architecture must be limited to the hardware resources available in that individual FPGA. Scalability may only be achieved by straightforward replication of the same architecture on multiple FPGAs to create a processor cluster. This solution provides no means for scheduling, partitioning and mapping a functional task onto a hybrid network of FPGAs, memory banks and processors.

Finally, FPGAs have also been used to implement specific algorithms. For example, TimeLogic Corporation, of Carlsbad, Calif., offers an FPGA implementation of standard bioinformatics algorithms. Unfortunately, such implementations are typically not dynamically scalable, and are not flexible.

The flexibility provided by FPGAs offers great promise for high performance computing applications, but as outlined hereinabove, previous solutions have failed to take full advantage of this opportunity. It is believed that the problem lies not in the ability to combine FPGAs with memory devices, processors and other components into hybrid networks, but in the ability to provide general purpose hardware accelerators that may be re-partitioned by the application users as desired. Thus, a need exists for a flexible methodology for scheduling, mapping and partitioning computational tasks onto scalable high performance networks of FPGAs, memory arrays and processors.

SUMMARY OF THE PRESENT INVENTION

The present invention comprises a system having a scalable high performance network of FPGAs, memory arrays and processors and a tool for flexibly scheduling, partitioning and mapping computational tasks onto the network. Broadly defined, the present invention according to one aspect is an automated software tool implementing a functional task in a hybrid FPGA network that includes at least one field programmable gate array and at least one processor, at least one memory, or at least one processor and at least one memory, the automated software tool adapted to carry out the steps of scheduling portions of a functional task in a time sequence; partitioning a plurality of elements of the hybrid FPGA network by allocating or assigning network resources to the scheduled portions of the functional task; mapping the partitioned elements into a physical hardware design for implementing the functional task on the plurality of elements of the hybrid FPGA network; and iteratively repeating the scheduling, partitioning and mapping steps to reach an optimal physical hardware design.

In features of this aspect, the automated software tool is further adapted to implement the functional task in a hybrid FPGA network that includes a plurality of field programmable gate arrays; after reaching an optimal physical hardware design for the hybrid FPGA network, and after at least one of the plurality of the field programmable gate arrays, at least one processor, or at least one memory is removed from the hybrid FPGA network, the automated software tool is further adapted to iteratively repeating the scheduling, partitioning and mapping steps to reach a new optimal physical hardware design; after reaching an optimal physical hardware design for the hybrid FPGA network, and after at least one more field programmable gate array, processor, or memory is added to the hybrid FPGA network, the automated software tool is further adapted to iteratively repeating the scheduling, partitioning and mapping steps to reach a new optimal physical hardware design; the automated software tool is further adapted to carry out the iterative scheduling, partitioning and mapping steps while at least a first portion of the hybrid FPGA network is operating; the automated tool is further adapted to identify an unused second portion of the hybrid FPGA network to be reconfigured while the first portion of the hybrid FPGA network is operating; and the automated software tool is further adapted to, before beginning the scheduling, partitioning and mapping steps, receive a data file corresponding to a control data flow graph or a task graph representative of the functional task to be implemented in the hybrid FPGA network.

The present invention according to another aspect is an automatically reconfigurable high performance FPGA system, including: a hybrid FPGA network, having a plurality of field programmable gate arrays, at least one processor, and at least one memory; and an automated scheduling, partitioning and mapping software tool adapted to configure the hybrid FPGA network in order to implement a functional task.

In features of this aspect, the hybrid FPGA network includes one or more cluster or grid nodes, each connected to an FPGA board block; each of the one or more cluster or grid nodes is one of the at least one processors in the hybrid FPGA network; each FPGA board block includes a plurality of FPGA boards; and the at least one processor includes an embedded processor in one of the plurality of field programmable gate arrays.

The present invention according to yet another aspect of the present invention is an automated method for implementing a functional task in an FPGA network that includes a plurality of field programmable gate arrays, the automated method including: scheduling portions of a functional task in a time sequence; partitioning a plurality of elements of the FPGA network by allocating or assigning network resources to the scheduled portions of the functional task; mapping the partitioned elements into a physical hardware design for implementing the functional task on the plurality of elements of the FPGA network such that at least one field programmable gate array is mapped dissimilarly from another field programmable gate array; and iteratively repeating the scheduling, partitioning and mapping steps to reach an optimal physical hardware design.

In features of this aspect, the FPGA network is a hybrid FPGA network that includes a plurality of field programmable gate arrays combined with at least one processor and at least one memory, partitioning includes partitioning the plurality of field programmable gate arrays, the at least one processor and the at least one memory of the hybrid FPGA network, and mapping includes mapping the partitioned elements into a physical hardware design for implementing the functional task on the plurality of field programmable gate arrays, the at least one processor and the at least one memory of the hybrid FPGA network; the automated method further includes, after reaching an optimal physical hardware design for the hybrid FPGA network, removing at least one of the plurality of the field programmable gate arrays, at least one processor, or at least one memory from the hybrid FPGA network, and iteratively repeating the scheduling, partitioning and mapping steps to reach a new optimal physical hardware design; the automated method further includes, after reaching an optimal physical hardware design for the hybrid FPGA network, adding at least one more field programmable gate array, processor, or memory to the hybrid FPGA network, and iteratively repeating the scheduling, partitioning and mapping steps to reach a new optimal physical hardware design; the automated method further includes carrying out the iterative scheduling, partitioning and mapping steps while at least a first portion of the hybrid FPGA network is operating; the automated method further includes identifying an unused second portion of the hybrid FPGA network to be reconfigured while the first portion of the hybrid FPGA network is operating; and the automated method further includes, before beginning the scheduling, partitioning and mapping steps, receiving a data file corresponding to a control data flow graph or a task graph representative of the functional task to be implemented in the hybrid FPGA network.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION OF THE PREFERRED EMBODIMENTS

Figure 1:
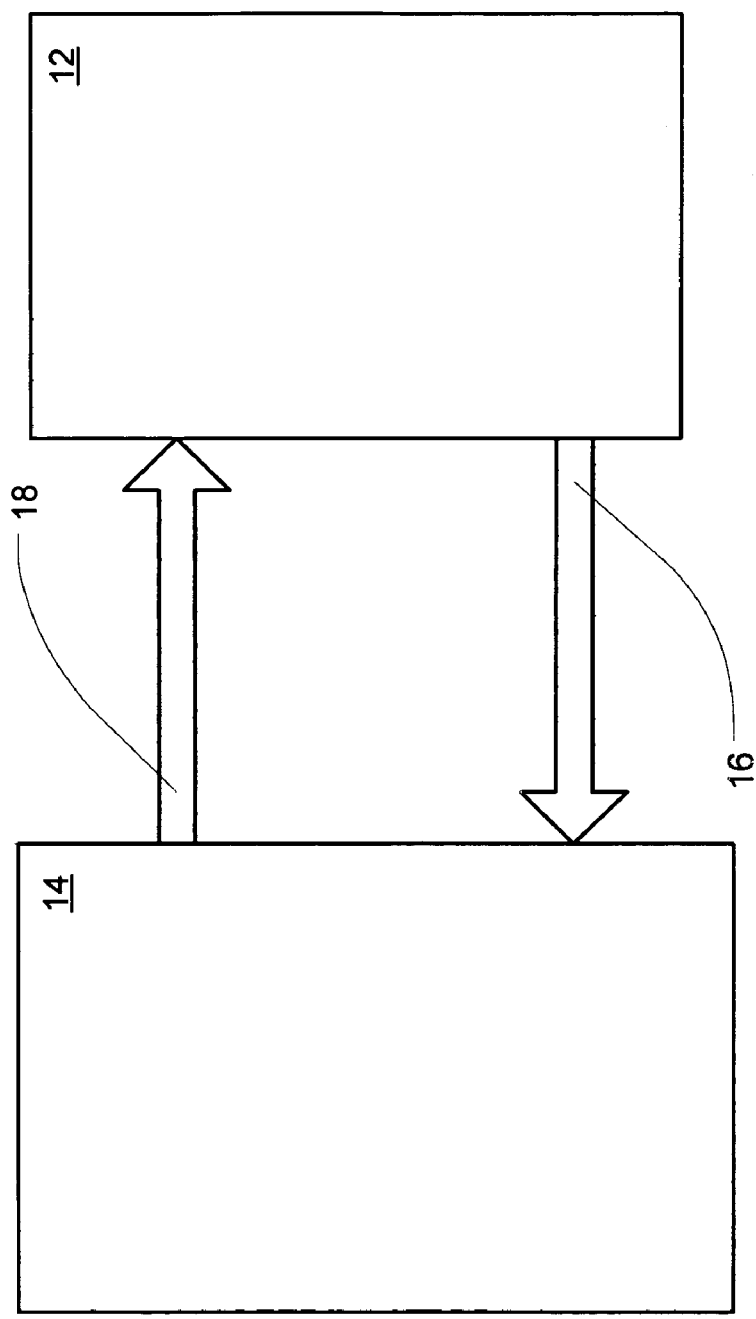
FIG. 1 is a block diagram of an optimizing system for hybrid FPGA networks in accordance with the preferred embodiments of the present invention.

Referring now to the drawings, in which like numerals represent like components throughout the several views, the preferred embodiments of the present invention are next described. The following description of the preferred embodiment(s) is merely exemplary in nature and is in no way intended to limit the invention, its application, or uses.

FIG. 1 is a block diagram of an optimizing system 10 for hybrid FPGA networks in accordance with the preferred embodiments of the present invention. The system 10 includes a hybrid network 12 of FPGAs operating in conjunction with a scheduling, partitioning and mapping ("SPM") methodology 14. As used herein, "scheduling" refers generically to a process of time sequencing a plurality of tasks or subtasks, "partitioning" refers generically to a process of allocating or assigning network resources to the tasks or subtasks, and "mapping" refers generically to a process of developing a physical hardware design for implementing the task or subtasks in actual hardware. As used herein, the term "hybrid network" typically refers to a collection of elements including one or more processors (Windows, Unix or Linux based server or client computers), preferably making up the nodes of a cluster or grid, that are upgraded with FPGA boards for hardware acceleration, together with the FPGAs and memory bank chips on those FPGA boards. However, it will be apparent that the system 10 of the present invention has applicability to networks that include only a plurality of FPGAs as well as networks that include a single FPGA with one or more processors and/or one or more memory chips.

The SPM methodology 14 is the software methodology and tool that implements application designs onto the hybrid network 12, controls data flow, and schedules executions on the network 12 using application program interfaces, to generate fast and accurate computed results. Inputs 16 to the SPM methodology 14 include a map of the available hardware resources in the hybrid network 12, user constraints, technology constraints and electrical parameters of the hybrid network 12, and a Hardware Description Language ("HDL") or Control Data Flow ("CDF")/Task Graph of the application design. Using these inputs 16, the SPM methodology 14 determines an optimized architecture for the hybrid network 12 and produces, as outputs 18, the corresponding configuration bit streams and control signals used to map the architecture design onto the hybrid network 12.

Figure 2:
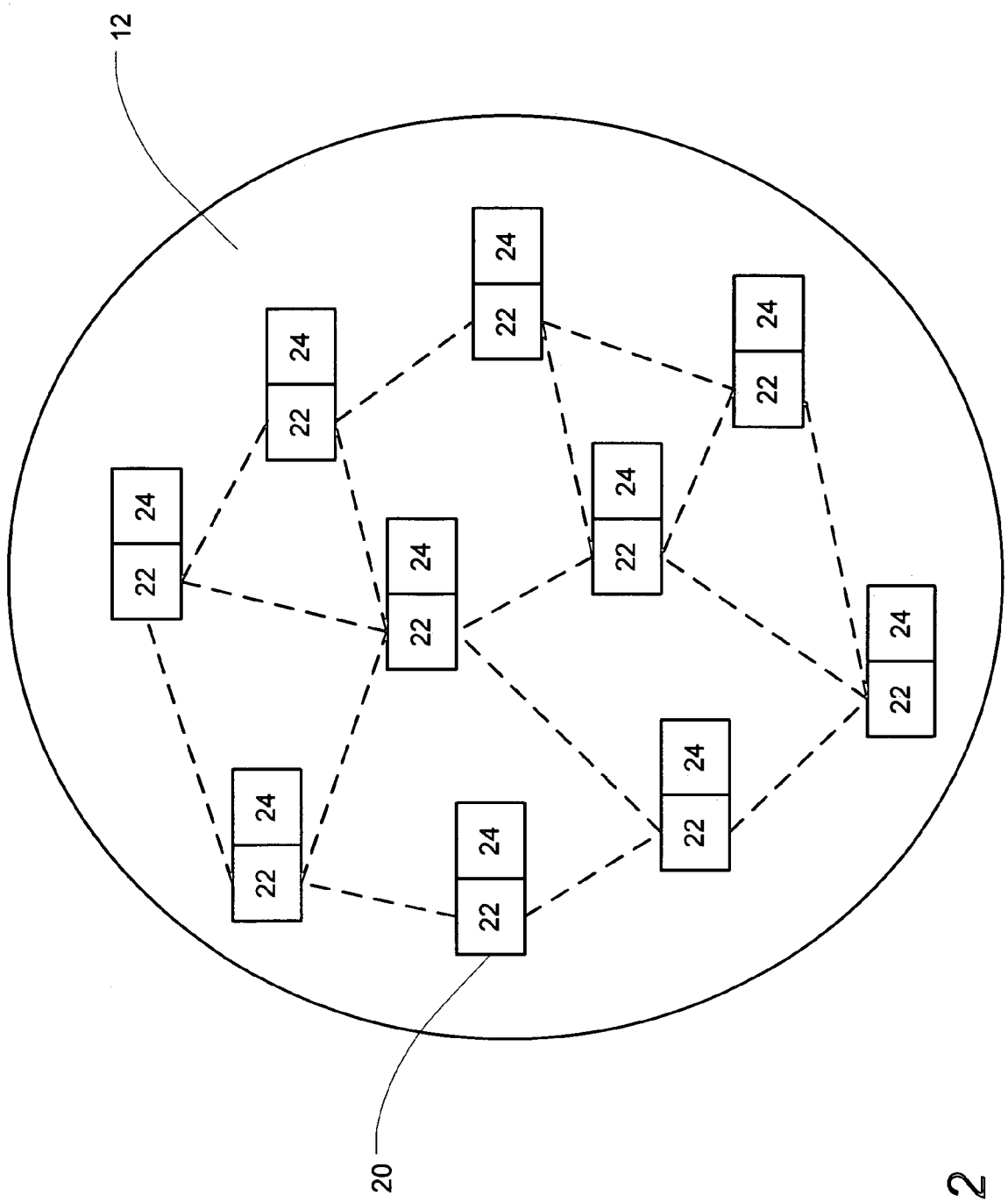
FIG. 2 is a block diagram of the hybrid network of FIG. 1.

FIG. 2 is a block diagram of the hybrid network 12 of FIG. 1. The hybrid network 12 includes one or more cluster or grid nodes 22, each connected to a FPGA board block 24. Each node. 22 may be understood to be any Windows-, Unix- or Linux-based server or client computer. Communication links connect various nodes 22 in the network 12 together, but it will be apparent that the particular network communication links illustrated in FIG. 2 are provided merely for illustrative purposes, and that any implementation of such a network 12 may be defined and arranged according to user preferences.

As shown, one of the nodes 22 functions as a master server 20 in that it provides the interconnection point between the network 12 and the SPM tool 14. It is the master server 20 on which the SPM tool 14 is installed. This machine also has maintains a hardware map of the entire hybrid network 12. The networking or connectivity topology can be anything such as, but not limited to, taurus and mesh. The hardware map is updated continually or periodically as the topology of the network 12 changes, thereby representing a current description of the network 12 at all times.

The other cluster or grid nodes 22 are machines that have an FPGA board block 24 connected thereto. It will be apparent that the master server 20 and/or any of the other nodes 22 may also be incorporated into other network permutations that may further include other nodes (not shown) to which no FPGA board block 24 is connected.

Figure 3:
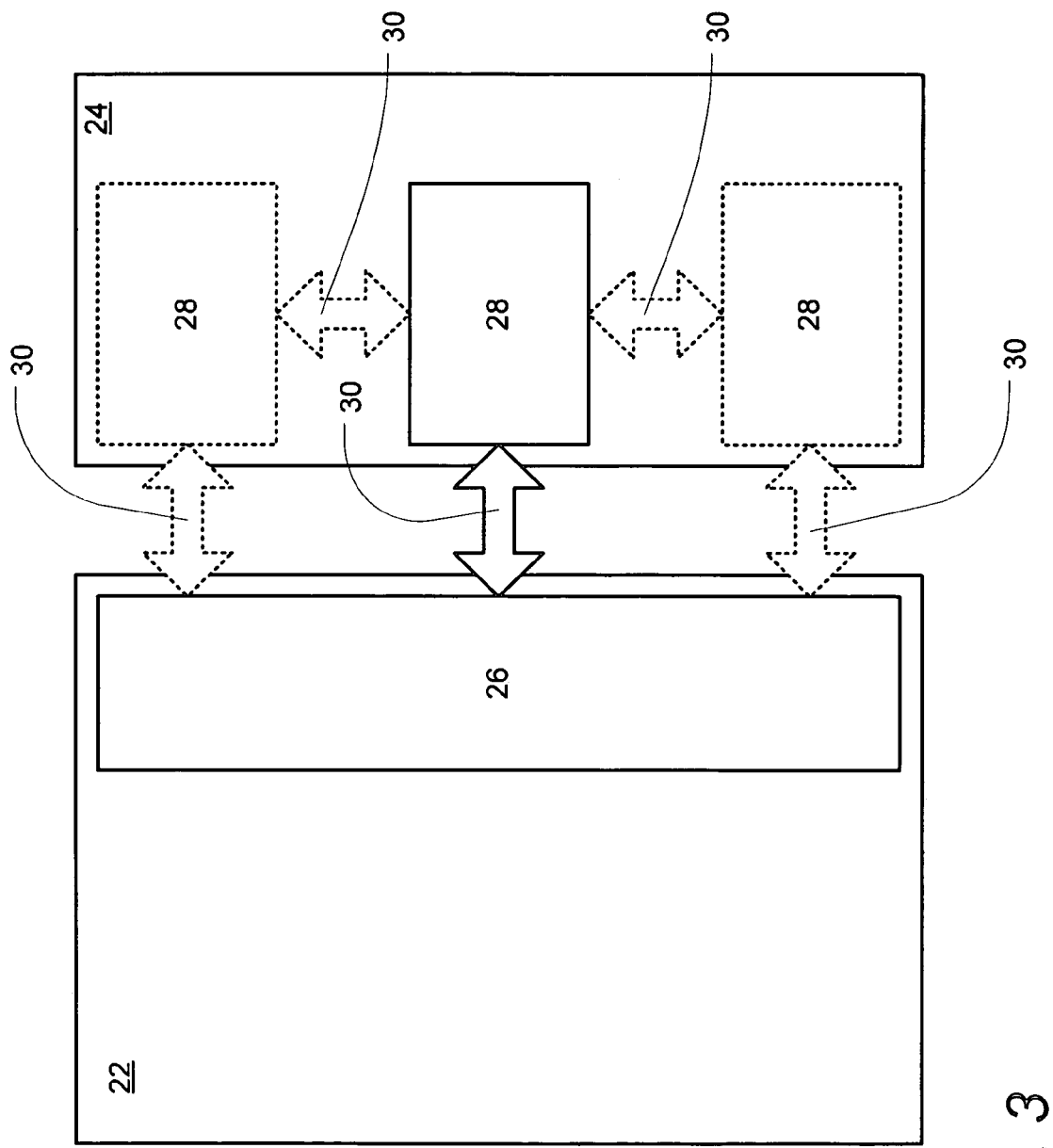
FIG. 3 is a block diagram illustrating the exemplary interconnection between one of the host machines of FIG. 2 and its FPGA board block.

FIG. 3 is a block diagram illustrating the exemplary interconnection between one of the host machines 22 of FIG. 2 and its FPGA board block 24. As shown therein, each FPGA board block 24 includes at least one, and preferably several, FPGA boards 28. In turn, each board 28 can have multiple FPGAs 32 and memory chips 34, best seen in FIG. 4, all interconnected by one or more buses 30. Each host machine 22 is interconnected with an interface 26 that communicates with the FPGA boards 28 to transfer data and instructions between the FPGAs 32 using the buses 30. The various FPGA boards 28 may be interconnected through some interfacing mechanism thorough the node, or directly with each other. Thus, the machine at each grid node 22 is connected to the various FPGAs 32 on the one or more FPGA boards 28 via the interface 26 and the various buses 30. The methodology of the present invention can handle any type of intra-board and inter-board interconnections. Buses or interfaces suitable for use in the preferred embodiments of the present invention include, but are not limited to, a conventional PCI bus (such as an industry standard PCI Express™ bus) or a dual in-line memory module ("DIMM") bus, but the particular bus or interface used is not important to the system 10 of the present invention as long as a model for such bus or interface may be appropriately defined to the SPM tool 14.

From the perspective of the SPM tool 14, any number of FPGAs 32 and memory chips 34 can be on an FPGA board 28, and any on-board communication topology and model can be supported. It will be understood by those of ordinary skill, however, that physical constraints may otherwise place limitations on these parameters. Further, any type of network topology and connection 30 can be handled by the SPM methodology 14, provided a communication model is available for that topology/connection 30.

Figure 4:
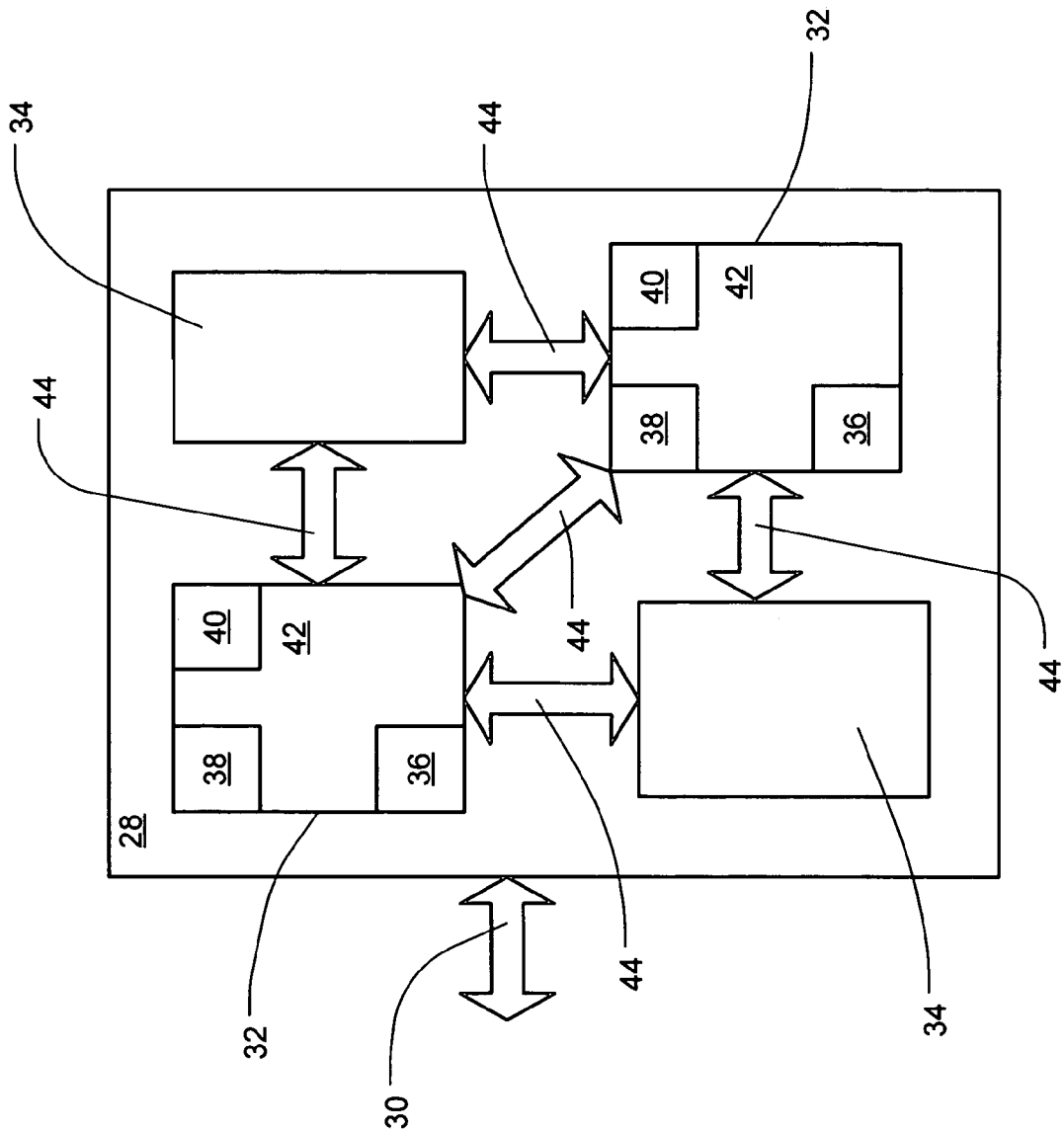
FIG. 4 is a block diagram of an exemplary FPGA board suitable for use in the system of the present invention.

FIG. 4 is a block diagram of an exemplary FPGA board 28 suitable for use in the system 10 of the present invention. This exemplary FPGA board 28 may include one or more FPGAs 32 and one or more memory chips 34, all interconnected by buses 44 such as, but not limited to, multi-gigabit buses. Each FPGA 32 may include embedded processors 36, embedded block-memory 38, and/or embedded custom circuits 40, together with a reconfigurable portion 42. Examples of suitable processors 36 include a PowerPC core in an FPGA such as the Virtex-Pro FPGA available from Xilinx. Examples of suitable embedded custom circuits 40 include custom multipliers in an FPGA such as the Virtex-Pro.

Together, the various components of the hybrid network 12 may be utilized by a user application program to carry out the functionality of that program. The user application program typically resides in the master server 20, but may have threads running on other processors 22, 36 in the hybrid network 12.

Figure 5:
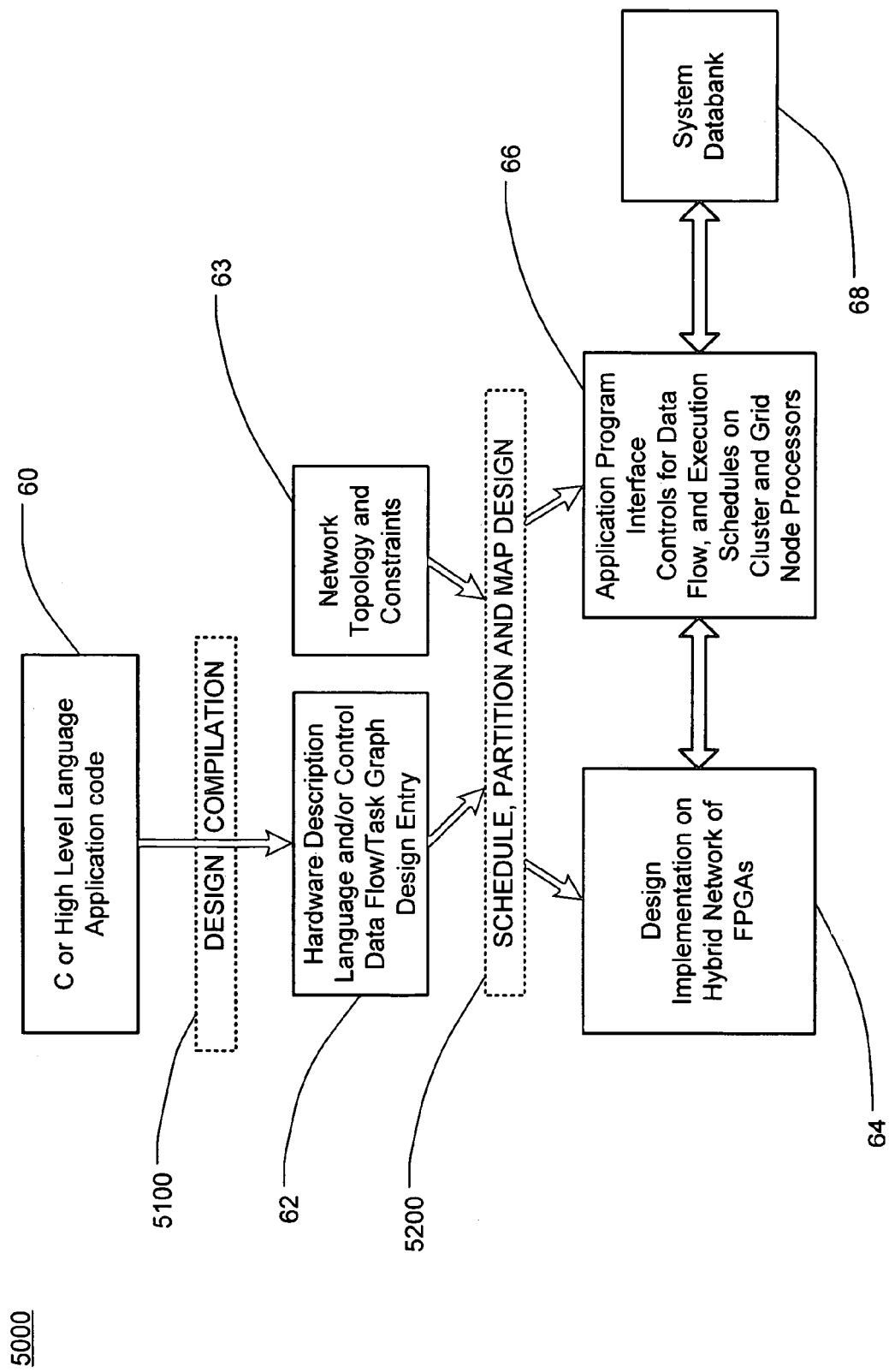
FIG. 5 is a high level data flow diagram illustrating the operation of the system of FIG. 1.

FIG. 5 is a high level data flow diagram 5000 illustrating the operation of the system 10 of FIG. 1. In FIG. 5, the solid arrows correspond to processes, the rectangles correspond to the results of those processes or other computations, and the unfilled arrows represent communication between or movement of data. As shown therein, one primary input to the system 10 is a description 60 of the application in C or another high level programming language. The code is compiled at process step 5100 into a HDL and/or CDF or task graph 62 that is provided as an input 16 to the SPM tool 14. Software suitable for compiling or converting C to a HDL, such as VHDL, is available from Celoxica, of Oxfordshire, United Kingdom, or Impulse Accelerated, of Kirkland, Wash. Another primary input to the system 10 is a physical description 63 of the network topology and constraints, including a map of the network and its components, user constraints, technology constraints, electrical parameters, and the like. This information may generally be contained in a plurality of different files.

As shown at process step 5200, the SPM tool 14 may then be used to schedule, partition and map the functional design represented by the CDF or task graph 62 into an actual design implementation 64 on the hybrid network 12 as well as establishing software controls 66 used by the user application program to interface with the design 64. The software controls 66 include the application programming interface ("API") controls for data flow as well as execution schedules for the various cluster and grid node processors 22, 36. In operation, the software controls 66 communicate with the hybrid network design 64 to control its operation, calling on data stored in a system databank 68, or storing new data in the databank 68, as necessary.

Figure 6:
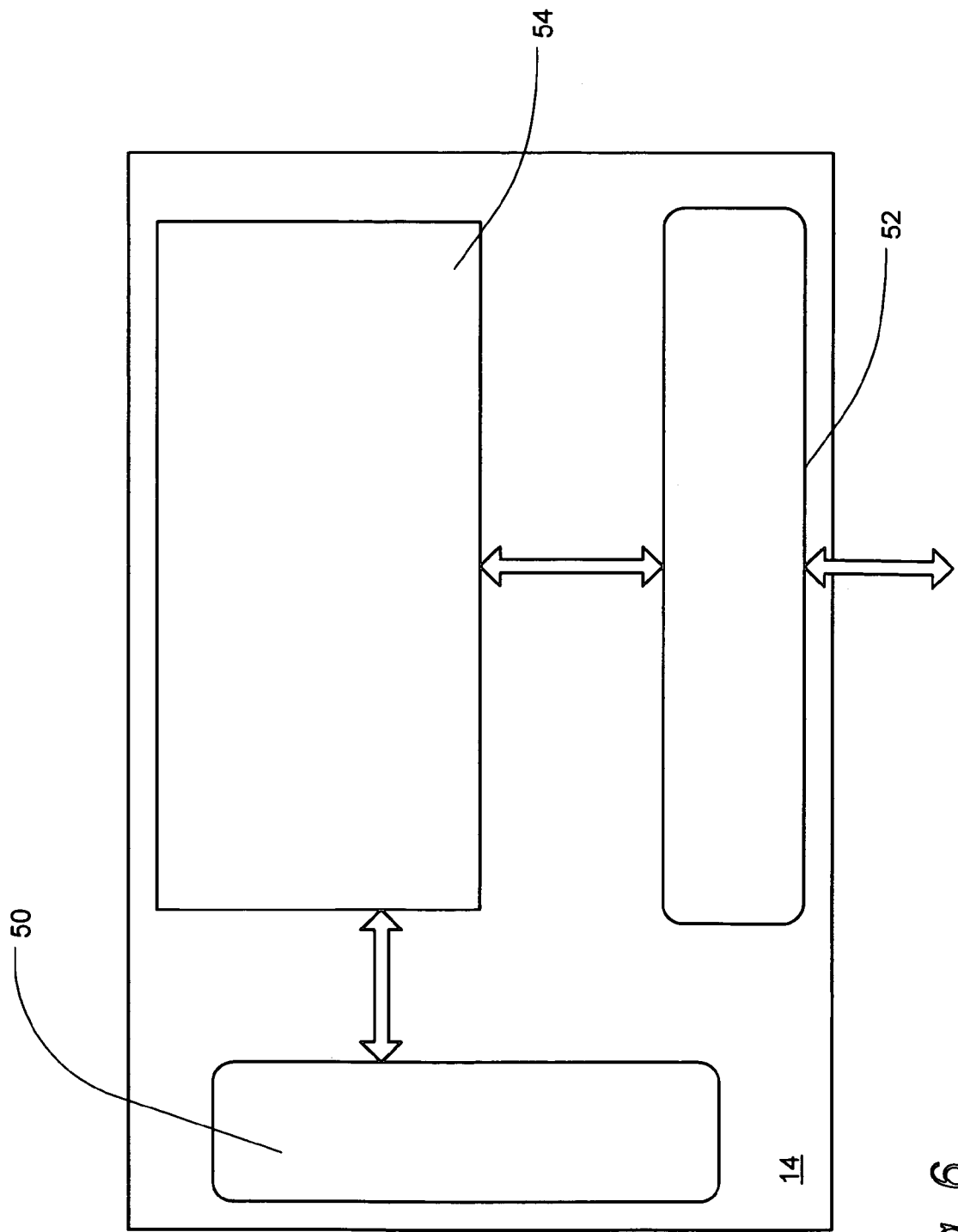
FIG. 6 is a block diagram of some of the components of the SPM tool of FIG. 2.

FIG. 6 is a block diagram of some of the components of the SPM tool 14 of FIG. 2. The SPM tool 14 includes a library 50 and an interface 52 as well as the core SPM functionality 54 itself, used to carry out the SPM processes 5200. The library 50 houses a collection of certain subtasks and their optimized implementations on FPGAs 32 and other hybrid network resources. By way of example, these subtasks may include, but are not limited to, such functional operations as convolution, matrix multiplication, sequence matching, and the like. The library 50 could be specific to certain classes of applications; i.e., to certain groups of applications having common computational characteristics. The core SPM functionality 54 may use this library 50 during the optimized implementation of a design onto the hybrid FPGA network 12. The interface 52 includes a collection of data structures, which are computational artifacts used to efficiently store and process data The interface 52 is the functional interconnection point between the SPM design environment 14 and the hybrid FPGA network 12. This unique and efficient interface 52 allows the design methodology 14 to accept and work with any hybrid FPGA network 12. The interface 52 includes a collection of data structures, which are computational artifacts used to efficiently store and process data These data structures contribute to the efficiency of the SPM tool flow 5200.

To realize the vision of using hybrid networks 12 of FPGAs 32, memory arrays 34, embedded processor cores 36 and cluster or grid processors 22 for high speed computation, a scalable methodology is required for automated scheduling, mapping, and partitioning of computational tasks onto the hybrid network 12. One possible strategy for implementing such a methodology is the use of hypergraphs. As is well known, a hypergraph is a generalization of a conventional graph wherein a set of edges is replaced by a set of hyperedges. A hyperedge extends the notion of an edge by allowing more than two vertices to be connected together.

Figure 7:
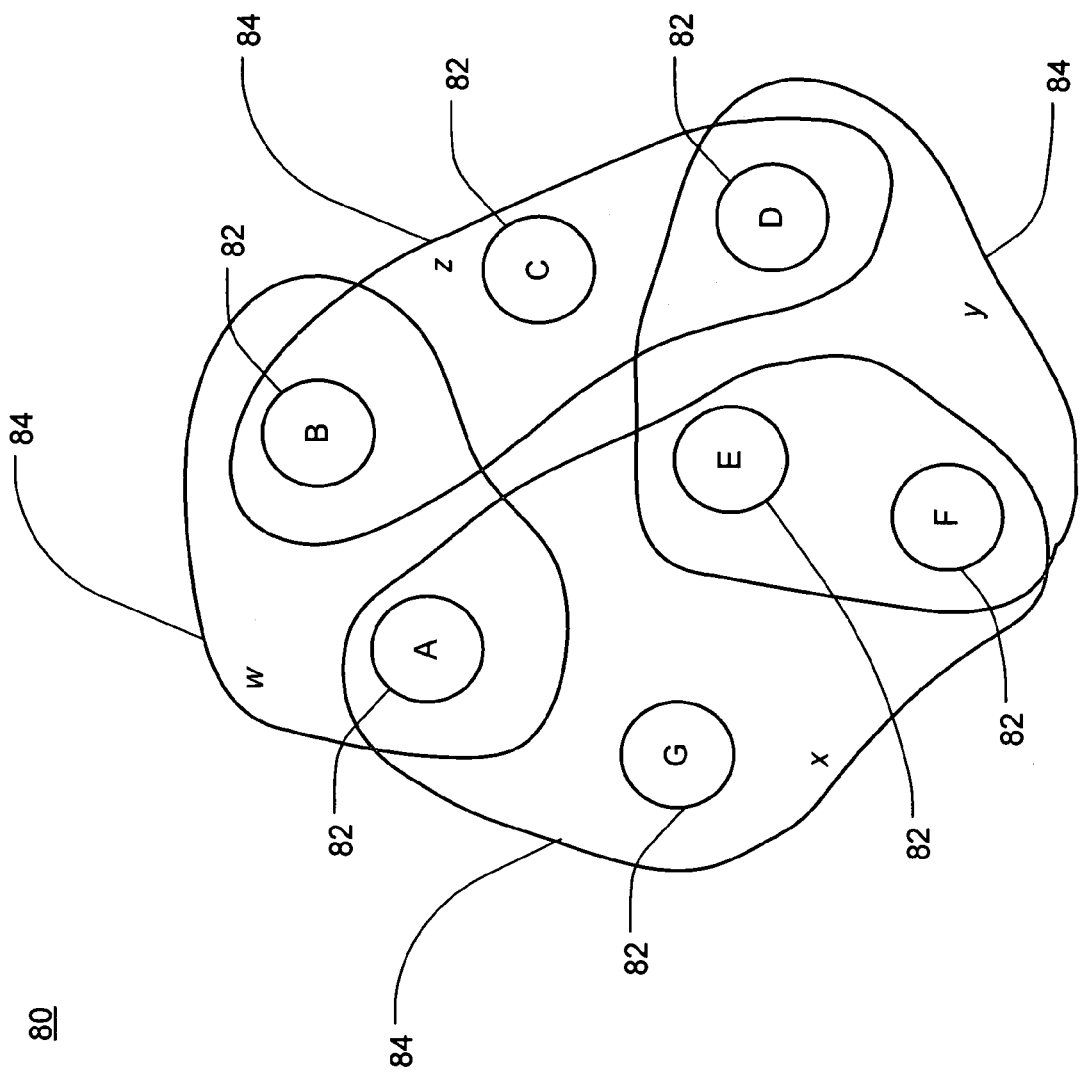
FIG. 7 is an exemplary hypergraph representation of a control data flow graph or task graph.

FIG. 7 is an exemplary hypergraph ("H") representation 80 of a CDF graph or task graph, wherein the hypergraph 80 includes seven vertices 82 (A, B, C, D, E, F and G) connected by four hyperedges 84 (w, x, y and z). As applied in the present context, a vertex 82 in the hypergraph 80 corresponds to a single task or function to be carried out by the hybrid network 12, and a hyperedge 84 exists between several vertices 82 if the output of the task represented by one vertex 82 drives inputs of the tasks or functions represented by adjacent vertices 82. It should be noted that not all vertices 82 compute equally frequently as each other; rather, the use of a vertex 82 depends on the frequency with which the corresponding task is used in an application. Thus, a hyperedge 84 is weighted by a function of how frequently the vertices associated 82 with it are used. This may be referred to as its "static" weight. The weight of a particular hyperedge is also affected by such factors as properties of partitioning in the hybrid network 12, the different nodes 22 in the network 12, the different FPGA board layouts, the communication hardware in the network 12, the nature of the computation cluster or grid, and the like. These weights change dynamically during the partitioning process.

The goal is to partition the vertices of H into k parts, where k is the number of FPGAs 32, node processors 22, embedded processors 36, and memory blocks 34 in the hybrid network 12, or unused portions thereof, such that the costs of hyperedges 84 connecting vertices 82 in different parts are minimized. As used herein, the "cost" could be the latency, power dissipation, throughput, or even reliability. Each of the k partitions has space constraints. The other constraints in the hybrid network 12 could be maximum latency, throughput, power dissipation, thermal capacity, or the like.

Procedural Strategy

Figure 8:
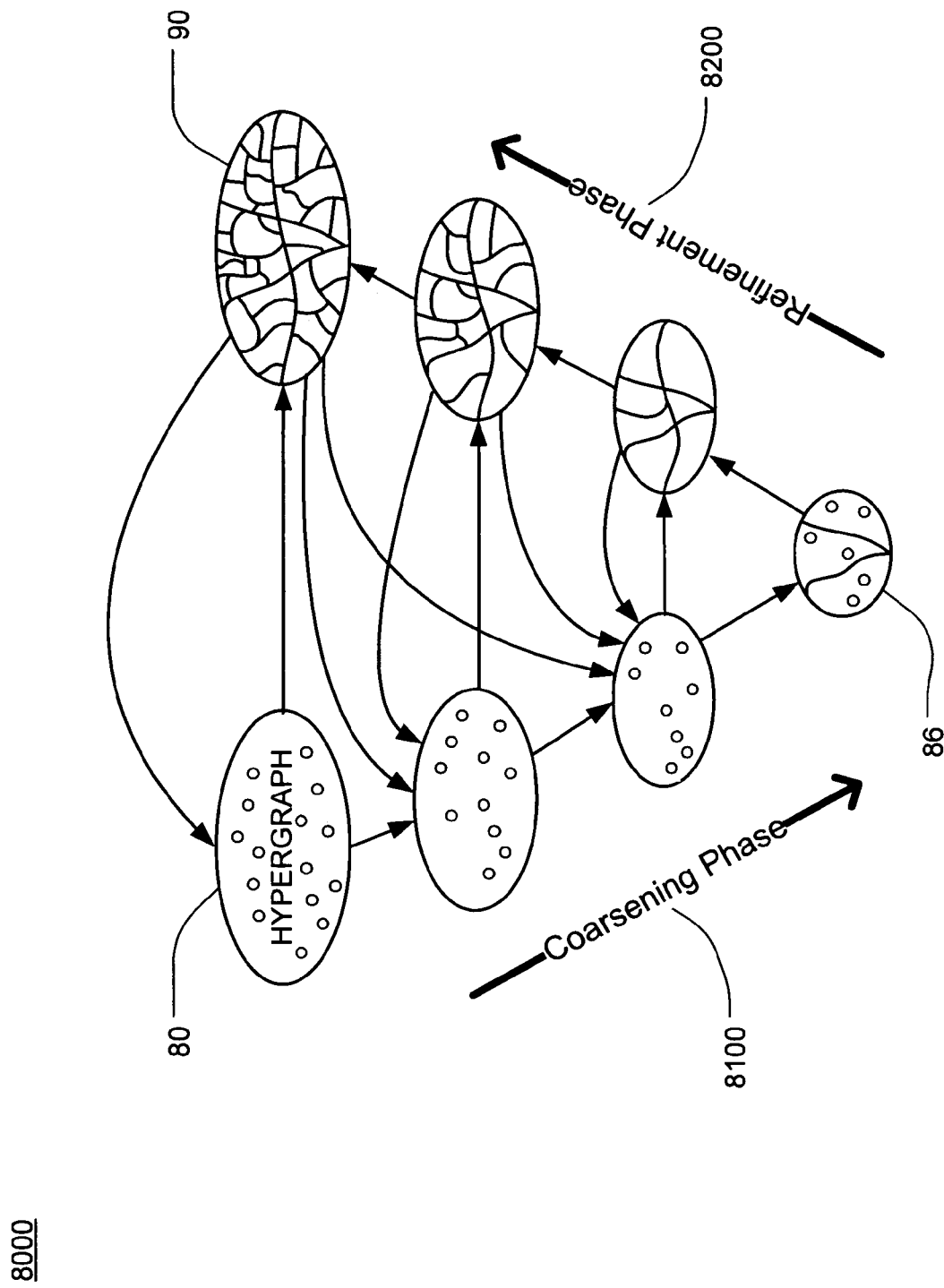
FIG. 8 is a graphical illustration of the evolution from the hypergraph representation of FIG. 7 to an optimal partitioned solution.

FIG. 8 is a graphical illustration of the evolution from the hypergraph representation 80 of FIG. 7 to an optimal partitioned solution 90. Because similar processes are generally well known to those of ordinary skill in the art, the following represents only a brief description of an automated partitioning process 8000. Starting with the hypergraph H 80 of FIG. 7, the graph 80 is gradually coarsened by iteratively mapping clusters of vertices 82 to single abstracted vertices, and forming new hyperedges 84 to reflect connectivities between the clusters thus mapped. As this process is repeated, the number of separate vertices is gradually reduced and the size of the coarsened hypergraph 86 is minimized. The scheduled and partitioned tasks or subtasks may be iteratively mapped into an intermediate proposed physical implementation, and the dynamic weights of the new hyperedges 84, i.e., the weights that are based on the physical implementation aspects of the design, may be simultaneously updated based on this current implementation. This coarsening phase 8100 helps abstract the system-level properties of the application, and better map it to the hybrid network 12. Moreover, it can achieve orders-of-magnitude speed-up during optimization. Upon reaching a certain threshold, the process 8000 is stopped when the desired amount of coarsening has been completed, and the resulting coarse hypergraph 86 is partitioned during an iterative refinement phase 8200. The threshold is determined using an adaptive process. The adaptation may be done by a user in an empirical fashion, or may be accomplished automatically in an evolutionary feature, wherein the tool 14 learns by itself from its previous experiences. Such techniques are well known to those of ordinary skill in the art.

During the refinement phase 8200, new partitions are recursively made inside the previous partitions, and this is done until the best solution is obtained. At any step during refinement 8200, it is possible to go back to the coarsening phase 8100 to try out alternate solutions. This is illustrated in FIG. 8 by the various arrows connecting the various stages of the coarsening and refinement processes 8100, 8200 together.

As will be apparent to one of ordinary skill in the art, all of the traversals in FIG. 8 may be controlled by a "Simulated Annealing"-type algorithm, a "Genetic"-type algorithm, or the like. Such algorithms generally have several parameters and functions which will need to be determined. In one approach to this process, the parameters may be initialized to some feasible values, a number of applications may be mapped to the hybrid network 12 using the present methodology 5200, the execution results may be observed, and the methodology may automatically learn from that to fine tune the parameters and functions in the algorithms to get the best results. This evolution may be built into the automated methodology 5200, so that optimized parameters and functions are determined automatically and dynamically. The evolution mechanism will preferably run in the background, and will generate new parameters and functions when new applications need to be mapped onto the hybrid network 12, or when the hybrid network 12 is changed by the addition or removal of hardware nodes consisting of FPGAs 32, memory banks 34 or processors 36.

The foregoing approach may be used in any of a variety of applications. Of course, the application does not matter to the system 10 as long as the algorithm to be implemented can be successfully encoded. Nonetheless, applications for which the system 10 of the present invention may be particularly suitable include bioinformatics and embedded high-performance computing.

Bioinformatics.

The past decade has witnessed an explosive growth of data from biology including genome projects, proteomics, protein structure determination, cellular regulatory mechanisms and the rapid expansion in digitization of patient biological data This has led to rise of a new area of research-bioinformatics, where powerful computational techniques are used to store, analyze simulate and predict biological information. While the raw computational power as predicted by "Moore's law", has led to the number of transistors that can be integrated doubling every 18 months, the genomic data at Genbank is doubling every 16 months. Proteomic and cellular imaging data is expected to grow even faster. Post-genomic era bioinformatics challenges such as simulation of biological networks, protein structure prediction, and ab-initio molecular dynamics simulations are expected to require high performance computing power of the order of several hundreds of teraflops or more.

The computational requirements for bioinformatics applications are as follows. First, because the number of laboratories requiring such computational power worldwide is in the hundreds of thousands, high performance computational capability must be made available to a large number of researchers in an easily usable low cost platform. Second, the diverse nature of the algorithms involved in various bioinformatics problems demands different computer architectures for optimum performance. Third, the rate of biological information growth is faster than Moore's law. Fourth, the databases are in the order of terabytes, requiring the data to be distributed.

FPGA-based hardware accelerators meet these requirements. First, FPGA-based hardware accelerators are low cost scalable systems. Second, their architecture is adaptable to bioinformatics algorithms to which they are applied. Third, their architectural fine-grained parallelism makes them less reliant on performance increase due to Moore's law. Finally, parallelism and realization of distributed memory in an FPGA-based hardware accelerator enables handling large datasets.

Embedded High Performance Computing

With regard to the applications mentioned above, the primary focus is on computing performance and a secondary focus is on power and form factor. However, in scenarios such as personal information appliances, battle fields, field hospitals, remote drilling operations and interplanetary and space exploration where the power source is limited, the power to performance ratio is critical. The computational requirements for these applications include low power consumption, rugged reliability and a low power to performance ratio. FPGA-based hardware accelerators work well here as well because their hardware is adapted to a particular application leading to realization of power efficient architectures, and fault tolerant architectures are more easily implemented.

Figure 9:
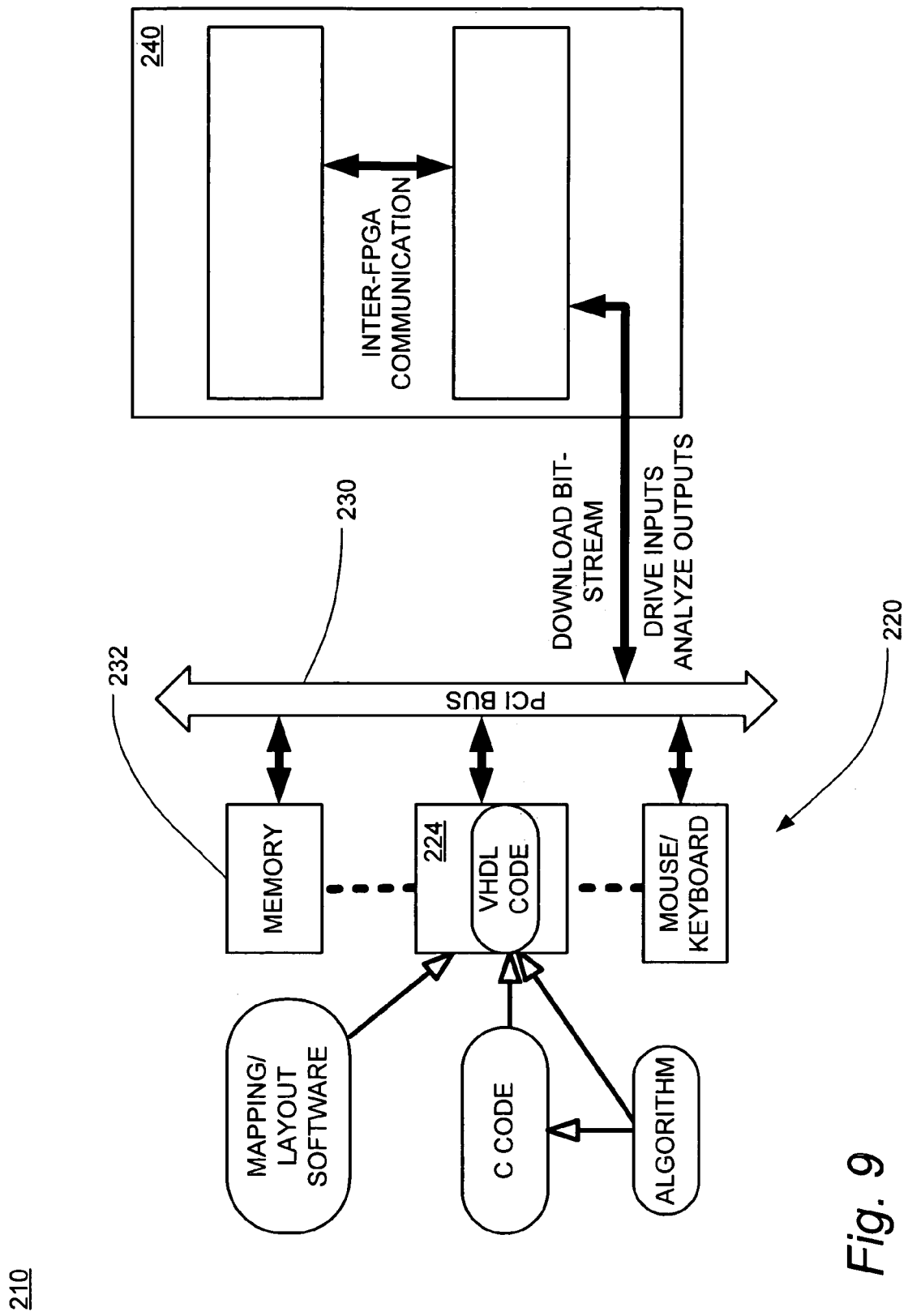
FIG. 9 is a block diagram illustrating an exemplary implementation of an optimized FPGA-based hardware accelerator system.

FIG. 9 is a block diagram illustrating an exemplary implementation of an optimized FPGA-based hardware accelerator system 210. The system 210 includes a reconfigurable hardware platform 240 interfaced with a PC device 220 via a conventional peripheral component interconnect ("PCI") bus 230. The PC device 220 may be of any conventional design and includes a memory 222, CPU 224 and one or more user interface devices 226, such as a mouse, keyboard or other conventional UI device, all conventionally connected to the PCI bus 230. The CPU 224 is adapted to execute code written in a hardware description language such as VHDL, Verilog or the like.

The reconfigurable hardware platform 240 includes a motherboard 250 on which are mounted a master FPGA board 260 and one ore more duplicate FPGA boards 270. One board suitable for use as either the master FPGA board 260 or as a duplicate FPGA board 270 is the BenNUEY board, available from Nallatech. On each FPGA board 260, 270 are mounted one or more FPGA 262. One FPGA suitable for use in the preferred embodiments of the present invention is the Vertex FPGA available from Xilinx. The master board 260 is interfaced with the PCI bus 230 of the PC device 220, while the master FPGA board 260 communicates with the duplicate FPGA boards 270 via a specialized FPGA interface 280, such as the fast DIME-II mechanism available from Nallatech.

A significant advantage of the system 10 of the present invention is its reconfigurability. Unlike previous efforts at reusing a network of FPGAs (with or without processor or memory elements), which require a user to manually develop a physical FPGA network design time a new functional task is to be implemented, the SPM tool 14 of the present invention allows any network 12 of FPGAs 32, including processor 32, 36 and memory elements 34, to be easily reconfigured as desired, whether the functional task being implemented involves a bioinformnatics application, an embedded high performance application, or another completely separate application.

Moreover, reconfiguration may occur dynamically; that is, portions of an FPGA 32, or of an FPGA network 12, may be reconfigured while other portions of the same FPGA 32 or FPGA network 12 are computing. This opens up the possibility of mapping new tasks or subtasks to portions of an FPGA 32 or FPGA network 12. In order to determine whether additional space (unused FPGA portions) may be available, it may be possible to predict, in advance (i.e., prior to the start of any computation), when a particular portion may be available. Alternatively, the determination of available FPGA portions may be completely environmental and data dependent, in which case the SPM tool 14 will include functionality to continuously or periodically monitor the situation and make changes accordingly in order to provide improved solutions when available FPGA portions permit.

Still another advantage of the system 10 of the present invention is its scalability. Functional tasks may be spread across as many or as few hybrid FPGA network resources as are available, and elements may be added or removed as desired without affecting the capabilities of the system 10, as long as the network topology may be effectively modeled at all times, and as long as the added or deleted elements are included or deleted from the model accordingly.

Based on the foregoing information, it is readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention. Accordingly, while the present invention has been described herein in detail in relation to its preferred embodiment, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof Although specific terms are employed herein, they are used in a generic and descriptive sense only and not for the purpose of limitation.

What is claimed is:

1. An automated software tool for implementing a functional task in a hybrid FPGA network that includes a plurality of network nodes, wherein at least two nodes include a processor and an FPGA board, each FPGA board having at least one field programmable gate array and at least one memory, the automated software tool adapted to carry out the steps of:

scheduling portions of the functional task in a time sequence, wherein at least some of the task portions are intended to be managed by separate processors, wherein the processor at one of the network nodes is a master processor on which the automated software tool is installed;

partitioning a plurality of elements of the hybrid FPGA network, including field programmable gate arrays and memories located on a plurality of FPGA boards, and further including a plurality of embedded processors, by allocating or assigning network resources to the scheduled portions of the functional task;

mapping the partitioned elements into a physical hardware design, including field programmable gate arrays and memories located on a plurality of FPGA boards, and further including the plurality of embedded processors, for implementing the functional task on the plurality of elements of the hybrid FPGA network; and iteratively repeating the scheduling, partitioning and mapping steps to reach an optimal physical hardware design, wherein the design elements include the field programmable gate arrays, the embedded processors, and the memories; and thereafter, after removal of at least one of the design elements from the hybrid FPGA network, iteratively repeating the scheduling, partitioning and mapping steps to reach a new optimal physical hardware design.

2. The automated software tool of claim 1, further adapted to implement the functional task in a hybrid FPGA network that includes a plurality of field programmable gate arrays.

3. The automated software tool of claim 1, wherein after reaching an optimal physical hardware design for the hybrid FPGA network, and after at least one design element is added to the hybrid FPGA network, the automated software tool is further adapted to iteratively repeat the scheduling, partitioning and mapping steps to reach a new optimal physical hardware design.

4. The automated software tool of claim 1, further adapted to:

carry out the iterative scheduling, partitioning and mapping steps while a first portion of the hybrid FPGA network is performing one or more functional tasks already scheduled, partitioned and mapped into the first portion of the hardware of the hybrid FPGA network.

5. The automated software tool of claim 4, further adapted to:

identify an unused second portion of the hybrid FPGA network to be reconfigured while the first portion of the hybrid FPGA network is performing one or more functional tasks already scheduled, partitioned and mapped into the first portion of the hardware of the hybrid FPGA network.

6. The automated software tool of claim 2, wherein before beginning the scheduling, partitioning and mapping steps, the tool is further adapted to receive a data file corresponding to at least on of a control data flow graph and a task graph representative of the functional task to be implemented in the hybrid FPGA network.

7. An automated method for implementing a functional task in a hybrid FPGA network that includes a plurality of network nodes, wherein at least two nodes include a processor and an FPGA board, each FPGA board having at least one field programmable gate array and at least one memory, the automated method comprising:

scheduling portions of the functional task in a time sequence, wherein at least some of the task portions are intended to be managed by separate processors, wherein the processor at one of the network nodes is a master processor on which the automated software tool is installed;

partitioning a plurality of elements of a hybrid FPGA network, the elements including field programmable gate arrays and memories located on a plurality of FPGA boards, and the elements further including a plurality of embedded processors, by allocating or assigning network resources to the scheduled portions of the functional task;

mapping the partitioned elements into a physical hardware design, including field programmable gate arrays and memories located on a plurality of FPGA boards, and further including a plurality of embedded processors, for implementing the functional task on the plurality of elements of the FPGA network such that at least one field programmable gate array is mapped dissimilarly from another field programmable gate array; and iteratively repeating the scheduling, partitioning and mapping steps to reach an optimal physical hardware design, wherein the design elements include the field programmable gate arrays, the embedded processors, and the memories;

thereafter, removing at least one of the design elements from the hybrid FPGA network; and iteratively repeating the scheduling, partitioning and mapping steps to reach a new optimal physical hardware design that is different from the original optimal physical hardware design.

8. The automated method of claim 7, wherein the FPGA network is a hybrid FPGA network that includes a plurality of field programmable gate arrays combined with at least one processor and at least one memory, wherein partitioning includes partitioning the plurality of field programmable gate arrays, the at least one processor and the at least one memory of the hybrid FPGA network, and wherein mapping includes mapping the partitioned elements into a physical hardware design for implementing the functional task on the plurality of field programmable gate arrays, the at least one processor and the at least one memory of the hybrid FPGA network.

9. The automated method of claim 7, further comprising:
after reaching an optimal physical hardware design for the hybrid FPGA network, adding at least one design element to the hybrid FPGA network; and
iteratively repeating the scheduling, partitioning and mapping steps to reach a new optimal physical hardware design.

10. The automated method of claim 7, further comprising:
carrying out the iterative scheduling, partitioning and mapping steps while a first portion of the hybrid FPGA network is performing one or more functional tasks already scheduled, partitioned and mapped into the first portion of the hardware of the hybrid FPGA network.

11. The automated method of claim 10, further comprising:
identifying an unused second portion of the hybrid FPGA network to be reconfigured while the first portion of the hybrid FPGA network is performing one or more functional tasks already scheduled, partitioned and mapped into the first portion of the hardware of the hybrid FPGA network.

12. The automated method of claim 7, further comprising:
before beginning the scheduling, partitioning and mapping steps, receiving a data file corresponding to at least on of a control data flow graph and a task graph representative of the functional task to be implemented in the hybrid FPGA network.

* * * * *